United States Patent
Chesnes et al.

(10) Patent No.: US 7,846,261 B2
(45) Date of Patent: Dec. 7, 2010

(54) METHODS OF USING HALOGEN-CONTAINING ORGANIC COMPOUNDS TO REMOVE DEPOSITS FROM INTERNAL SURFACES OF TURBINE ENGINE COMPONENTS

(75) Inventors: Richard Patrick Chesnes, Cincinnati, OH (US); David C Fairbourn, Sandy, UT (US)

(73) Assignee: Aeromet Technologies, Inc., Sandy, UT (US)

( * ) Notice: Subject to any disclaimer, the term of this patent is extended or adjusted under 35 U.S.C. 154(b) by 481 days.

(21) Appl. No.: 11/276,098

(22) Filed: Feb. 14, 2006

(65) Prior Publication Data

US 2007/0190243 A1    Aug. 16, 2007

(51) Int. Cl.
  *B08B 9/00* (2006.01)
(52) U.S. Cl. ............. 134/19; 134/22.1; 134/22.16; 134/26; 134/28; 134/30; 134/34; 134/35; 134/36; 134/39; 134/40; 134/42; 427/230; 427/252; 427/255.23; 427/255.28; 427/327
(58) Field of Classification Search ........... 427/327, 427/252, 255.23, 255.28, 230; 134/19, 22.1, 134/22.16, 26, 28, 30, 34, 35, 36, 39, 40, 134/42
  See application file for complete search history.

(56) References Cited

U.S. PATENT DOCUMENTS

| | | | | |
|---|---|---|---|---|
| 2,970,067 A | * | 1/1961 | Grimes | 427/388.1 |
| 4,188,237 A | * | 2/1980 | Chasteen | 134/2 |
| 4,315,400 A | | 2/1982 | Cole et al. | |
| 5,071,486 A | * | 12/1991 | Chasteen | 134/2 |
| 5,263,541 A | | 11/1993 | Barthorpe et al. | |
| 5,373,986 A | * | 12/1994 | Rafferty et al. | 228/206 |
| 5,492,726 A | | 2/1996 | Rose et al. | |
| 5,523,169 A | | 6/1996 | Rafferty et al. | |
| 5,614,054 A | * | 3/1997 | Reeves et al. | 156/344 |
| 5,685,917 A | * | 11/1997 | Sangeeta | 134/2 |

(Continued)

FOREIGN PATENT DOCUMENTS

EP    1160352 A1    12/2001

OTHER PUBLICATIONS

Dayton Process Technical Document, "Fluorocarbon Cleaning Process, The Ultimate Cleaning Pretreatment for Superalloy Repair", Copyright 1990-2002, pp. 1-8.*

(Continued)

*Primary Examiner*—Sharidan Carrillo
(74) *Attorney, Agent, or Firm*—Wood, Herron & Evans, LLP

(57) ABSTRACT

Methods for cleaning surface deposits, such as sulfidation deposits or dust particles, from a surface bounding an internal passage in a turbine engine component. The surface deposits are cleaned by placing a halogen-containing organic compound, such as a fluorine-containing organic compound, into the internal passage and heating the component and organic compound to chemically react the halogen-containing species in the liquefied and boiling organic compound with the deposits. The temperature is further elevated to vaporize the chemically-modified deposits, which are moved by mass transport through the internal passage and out of the turbine engine component. An optional protective coating, such as a chromium or aluminum coating, may be applied to the cleaned surface of the internal passage.

32 Claims, 2 Drawing Sheets

U.S. PATENT DOCUMENTS

| | | | |
|---|---|---|---|
| 5,688,607 A | 11/1997 | Rose et al. | |
| 5,728,227 A * | 3/1998 | Reverman | 134/2 |
| 5,805,973 A | 9/1998 | Coffinberry et al. | |
| 5,843,585 A | 12/1998 | Alperine et al. | |
| 5,883,314 A | 3/1999 | Sievers et al. | |
| 5,898,994 A | 5/1999 | Miller et al. | |
| 5,900,102 A * | 5/1999 | Reeves | 156/344 |
| 6,103,186 A | 8/2000 | Sievers et al. | |
| 6,159,547 A | 12/2000 | McMordie et al. | |
| 6,367,686 B1 * | 4/2002 | Abriles et al. | 228/206 |
| 6,379,749 B2 | 4/2002 | Zimmerman, Jr. et al. | |
| 6,409,795 B2 | 6/2002 | Sievers et al. | |
| 6,416,589 B1 | 7/2002 | Lipkin et al. | |
| 6,758,985 B2 | 7/2004 | Brooks | |
| 7,146,990 B1 * | 12/2006 | Ngo et al. | 134/22.1 |
| 2001/0009246 A1 * | 7/2001 | Zimmerman et al. | 216/34 |
| 2001/0009247 A1 | 7/2001 | Brooks | |
| 2001/0052375 A1 | 12/2001 | Sievers et al. | |
| 2002/0102357 A1 * | 8/2002 | Das et al. | 427/374.1 |
| 2004/0115355 A1 * | 6/2004 | Bauer et al. | 427/376.1 |
| 2004/0247789 A1 | 12/2004 | Boucard et al. | |
| 2005/0035085 A1 | 2/2005 | Stowell et al. | |
| 2005/0241147 A1 | 11/2005 | Arnold et al. | |
| 2006/0042082 A1 * | 3/2006 | Minor et al. | 29/889.1 |
| 2006/0049236 A1 * | 3/2006 | Minor et al. | 228/119 |
| 2007/0190243 A1 * | 8/2007 | Chesnes et al. | 427/230 |

OTHER PUBLICATIONS

International Searching Authority, International Search Report issued in corresponding PCT Application serial No. PCT/US2007/061978 dated Feb. 21, 2008.

European Patent Office, Supplemental European Search Report issued in corresponding European application No. EP 07 75 6865 dated Dec. 1, 2009.

Kim, et al., "Fluoride ion cleaning of gas turbine components using PTFE grease" Surface and Coatings Technology, vol. 200, No. 24, Dec. 1, 2005, pp. 6740-6748.

* cited by examiner

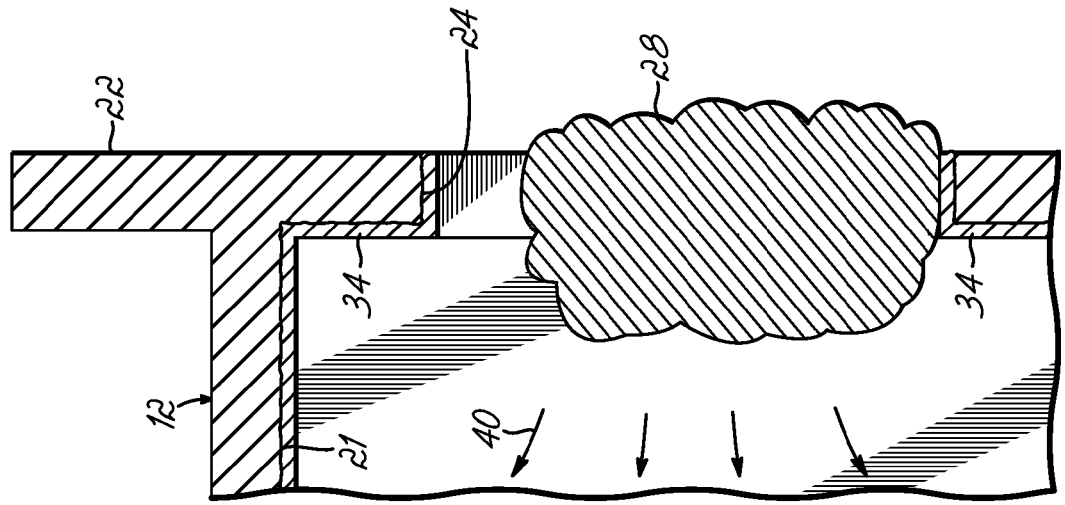
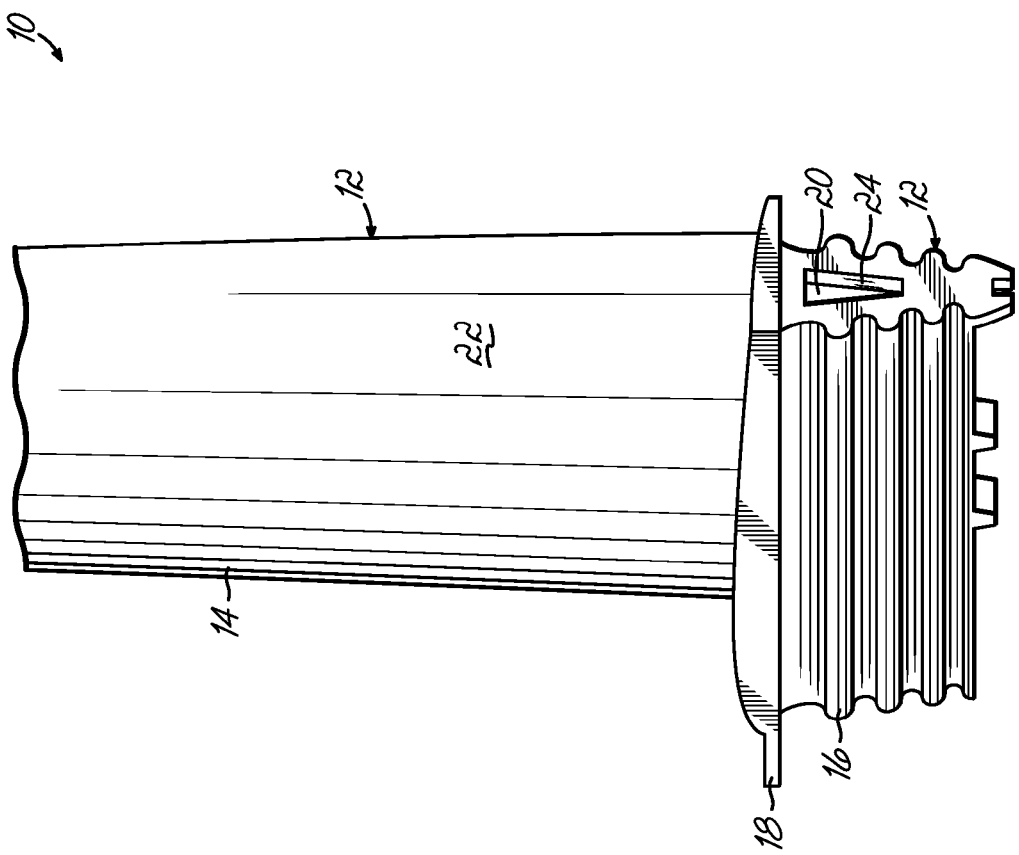

METHODS OF USING HALOGEN-CONTAINING ORGANIC COMPOUNDS TO REMOVE DEPOSITS FROM INTERNAL SURFACES OF TURBINE ENGINE COMPONENTS

FIELD OF THE INVENTION

The present invention relates to the cleaning of deposits from the internal surfaces of turbine engine components and, more particularly, to methods for removing deposits from the internal surfaces of turbine engine components and to the repair of such components by coating the internal surfaces after the deposits are removed.

BACKGROUND OF THE INVENTION

Components of high temperature turbine engines are often manufactured from nickel-, cobalt-, or iron-based superalloy materials, which are recognized as providing greater shape retention and strength retention over a wider range of operating temperatures than other candidate materials for these applications. Although superalloy materials exhibit improved mechanical properties at high operating temperatures, they are nonetheless susceptible to high temperature oxidation and hot corrosion. While the efficiency of a turbine engine generally increases with increasing operating temperature, the ability of superalloy materials to operate at such increased temperatures is limited by the ability to withstand such oxidation and corrosion.

Generally, gas turbine engines include a compressor for compressing incoming air, a combustor for mixing the compressed air with fuel, such as jet fuel or natural gas, and igniting the mixture, and a turbine blade assembly for producing power. In particular, gas turbine engines operate by drawing air into the front of the engine. The air is then compressed, mixed with fuel, and combusted. Hot combustion gases from the combusted mixture pass through a turbine, which causes the turbine to spin and thereby power the compressor.

External surfaces of superalloy turbine engine components, which may experience direct contact with the hot combustion gases, are susceptible to high temperature oxidation and hot corrosion that accelerates the oxidation process. These external surfaces are frequently provided with an intermetallic or aluminide overlayer or diffusion coating that protects the underlying superalloy material against high temperature oxidation and hot corrosion by forming a stable thermal oxide scale. High temperature oxidation and hot corrosion, if the temperature is sufficiently high, may form corrosive deposits which attack and degrade the protective scales.

At lower operating temperatures, external surfaces of superalloy turbine engine components are susceptible to a form of hot corrosion known as sulfidation corrosion. Sulfidation corrosion is most frequently observed on turbine engine components operating below 1500° F. Sulfidation corrosion forms deposits on the external surfaces of the superalloy material in the form of a metal sulfide scale.

Internal surfaces of a turbine engine component may not be protected by either an aluminide or chromide overlayer or a diffusion coating. In addition, these internal surfaces are subject to a significantly different service environment than the external surfaces of the turbine engine component. For example, internal passages in the turbine engine component may be supplied with a flow of bleed air from the engine compressor, rather than combustion gas, for reducing the operating temperature. Consequently, when the gas turbine engine is operating, the internal surfaces bounding these passages are at a lower temperature, typically about 1100° F. or cooler, than the external surfaces. As a consequence, sulfidation corrosion may cause deposits to form on the surfaces of these internal passages. The formation of sulfide scales incorporates nickel-based superalloy material from the walls, which operates to thin the wall sections of these internal passages. Progressive thinning may eventually lead to component failure from overly thin material in the wall sections.

Another type of deposit observed in the internal passages of turbine engine components is dust particles consisting, for example, of a mixture of silica, alumina, and calcium sulfate. During service in a turbine engine, these indigenous dust particles, which are commonly known as runway sweepings or Arizona Road dust, may infiltrate into internal passages of turbine engine components and deposit on the interior surfaces. Silicon and sulfur from the dust particles may diffuse into the turbine engine component, which may reduce the melting point of the superalloy material or may precipitate the occurrence of sulfidation corrosion. Because deposits that form or accumulate on the internal surfaces of turbine engine components, whether originating from sulfidation corrosion or dust particles, cause damage, it is desirable to remove these deposits with a cleaning process.

Batch thermo-chemical cleaning processes may be used to clean the external surfaces of turbine engine components. One such process known as fluoride ion cleaning (FIC) generally relies on the high reactivity of fluorine or fluoride ions for cleaning the exterior surface. However, cleaning internal surfaces of the turbine engine component differs dramatically from cleaning the external surfaces. Because of the flow restrictions imposed by the small diameter of the internal passages (typically from about 0.1 inch to about 0.5 inch), FIC cleaning may be ineffective for removing deposits from the interior passages. FIC cleaning would require piping to conduct the gases from a FIC cleaning reactor to the internal passages, which raises the cost of the cleaning system. In addition, FIC cleaning is a relatively hazardous and environmentally unfriendly method of cleaning turbine engine components. FIC cleaning is not customarily used on turbine blades because of the tendency to cause intergranular attack on the blades, which could lead to cracking and to eventual catastrophic failure.

SUMMARY OF INVENTION

The present invention is directed to an improved method to clean or remove sulfidation deposits that either form or collect on the internal surfaces of turbine engine components during use in a turbine engine. To that end and in accordance with one aspect of the present invention, a blended substance including a halogen-containing organic compound, preferably a solid fluorine-containing organic compound, is inserted into an internal passage bounded at least a portion of the internal surface and the organic compound and turbine engine component are heated. In a first phase of the cleaning process, the organic compound is heated to a first temperature above the melting point and, preferably, at the boiling point at which the melted or liquefied organic compound begins to turn into a gas. A halogen, such as fluorine, in the boiling fluorine-containing organic compound readily reacts with the deposits. The deposits may be dissolved into the liquefied and boiling organic compound. The deposits may also be modified chemically by the boiling organic compound to various halogen-modified solid compounds, such as metal fluorides. As the organic compound boils, amounts of vapor are released that contain amounts of the organic compound and the dissolved deposits. Preferably, the material constituting the deposits is fully converted to halogen-modified solid compounds and/or dissolved into the boiling organic compound. The time required for conversion/dissolution at least partially determines the treatment time in this initial phase of the cleaning process.

In a subsequent second phase of the treatment process, the temperature of the boiling organic compound and turbine engine component is raised to a higher temperature above the first temperature. The second temperature is sufficiently high to promote rapid vaporization of halogen-modified solid compounds, the liquefied organic compound, and dissolved material in the liquefied organic compound originating from the reacted deposits (i.e,. metal halides). The vapors or gases are removed from the internal passage and out of the turbine engine component by mass transport of the gases through the internal passage and any interconnected passages to one or more external ports. Preferably, the deposits are fully removed by the chemical cleaning process. However, any residual deposits are believed to have diminished size and to be loosened from the internal surface by the action of the boiling organic compound. These loosened deposits may be removed from the internal passage by a secondary treatment, such as a solvent bath or an air blast.

After thorough cleaning, a protective coating, such as a chromide or aluminide coating, may be optionally formed on the cleaned surface to repair regions of the internal passage from which the deposits have been cleaned and to also provide a protective coating to reduce the likelihood of new or additional sulfidation corrosion. The coating may be formed by placing a chromium-containing or aluminum-containing substance into the internal passage along with a fluorine-containing organic compound. Heating the turbine engine component causes the chromium-containing or aluminum-containing substance to release a vapor containing either chromium or aluminum, which is transported through the internal passage and deposits on the internal surface bordering the internal passage as a coating containing either chromium or aluminum.

The present invention may be integrated into a process that repairs, refurbishes, and rejuvenates used turbine engine components such that they may be returned to service. Such repair, refurbishment, and rejuvenation advantageously permits otherwise-unusable turbine engine components to be returned to service following appropriate processing.

These and other benefits and advantages of the present invention shall be made apparent from the accompanying drawings and description thereof.

BRIEF DESCRIPTION OF THE DRAWINGS

The accompanying drawings, which are incorporated in and constitute a part of this specification, illustrate an embodiment of the invention and, together with a general description of the invention given above, and the detailed description of the embodiment given below, serve to explain the principles of the invention.

FIG. 1 is a diagrammatic view of a turbine engine component with deposits on an internal surface;

FIG. 3 is diagrammatic cross-sectional view similar to FIG. 2C illustrating the optional application of protective coating to the cleaned internal surface in accordance with an alternative embodiment of the present invention.

DETAILED DESCRIPTION OF PREFERRED EMBODIMENTS

Figure 2C:
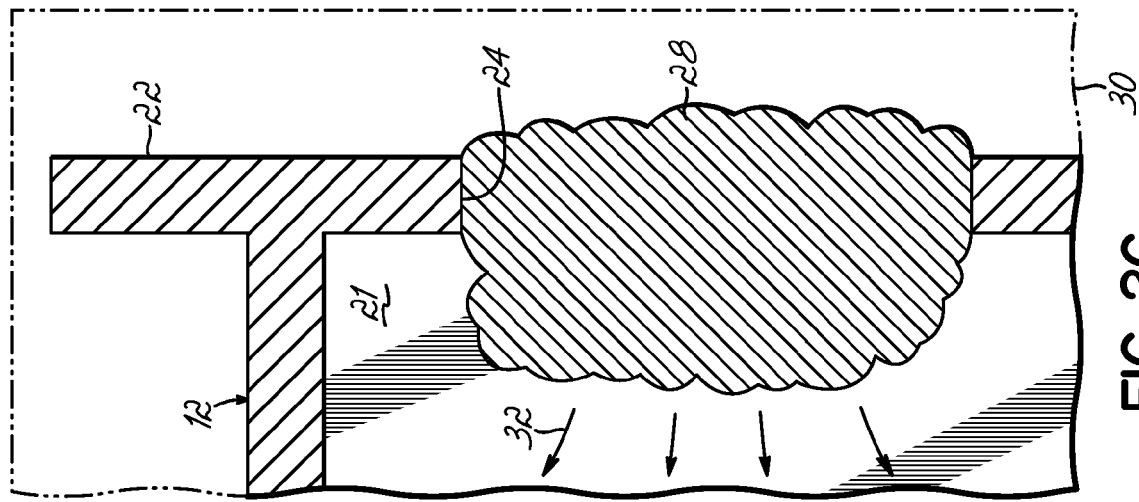
FIGS. 2A-C are diagrammatic cross-sectional views of a portion of the turbine engine component of FIG. 1 illustrating deposit removal from the internal surface in accordance with an embodiment of the present invention.
Figure 2B:
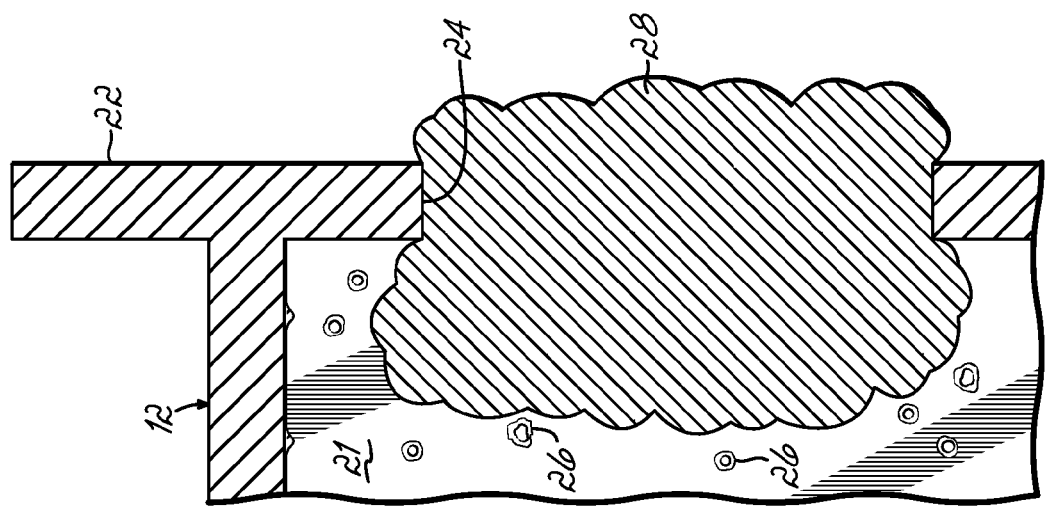
Figure 2A:
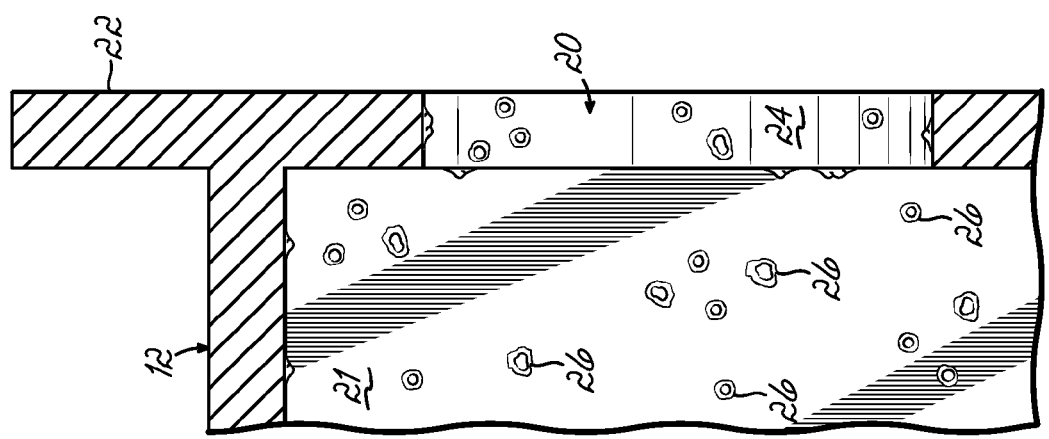

With reference to FIGS. 1 and 2A, a turbine engine component 10 (FIG. 1) includes a metallic substrate 12 constituted by any nickel-, cobalt-, or iron-based high temperature superalloy from which such turbine engine components 10 are commonly made. The base element, typically nickel or cobalt, is by weight the single greatest element in the superalloy material, which may also contain minor amounts of tungsten, hafnium, rhenium, molybdenum, tantalum, niobium, titanium, chromium, cobalt, and/or aluminum in the composition. During use, the turbine engine component 10 is mounted in a turbine engine and is normally removed from the turbine engine during normal turbine shutdown or at a routine maintenance interval. Although the turbine engine component 10 is depicted as a gas-cooled, high pressure turbine blade, the present invention is beneficial for cleaning and optionally coating internal surfaces of other types of components including, but not limited to, high pressure turbine nozzle guide vanes and blades, low pressure turbine vanes and nozzle guides, shrouds, or any other miscellaneous parts of a gas turbine engine for use in aircraft and industrial applications. While the advantages of this invention are particularly applicable to turbine engine components 10, the invention is generally applicable to any component having internal surfaces susceptible to the accumulation of deposits.

The turbine engine component 10 includes an airfoil segment 14 designed to be in the high-pressure, hot airflow path of a gas turbine engine (not shown). Projecting from airfoil segment 14 is a contoured dovetail or root 16 used to secure gas turbine engine component 10 to a slot on a turbine disk (not shown) of the gas turbine engine. The airfoil segment 14 joins the root 16 at a platform 18. The substrate 12 consists of the unitary construct including the airfoil segment 14, the root 16, and the platform 18.

Extending through the substrate 12 is at least one internal passage 20 bounded by an internal surface 21 of the substrate 12. Each internal passage 20 intersects an external surface 22 of component 10 to define a port 24 at one open end and at another port (not shown), which may be similar to port 24 or differ from port 24 in geometry, at an opposite open end that also intersects external surface 22. Each port 24 communicates with the environment surrounding the turbine engine component 10 and defines an access opening for a flow path extending through the corresponding internal passage 20. In particular, the internal passage 20 may permit a flow of cooling air between port 24 when the turbine engine component 10 is mounted in a turbine engine (not shown) and placed in service in the turbine engine. The flow of cooling air is effective for reducing the operating temperature of the airfoil segment 14.

The internal surface 21 of the internal passage 20 accumulates deposits 26 that form or collect when the turbine component 10 is in service in a gas turbine engine. The deposits 26 may form as scales arising from a hot corrosion mechanism, such as sulfidation corrosion. Alternatively, the deposits 26 may be collected as indigenous dust particles, which are commonly known as runway sweepings or Arizona Road dust, from the ambient operating environment of the turbine engine that infiltrate into the internal passage 20 and deposit on the internal surface 21. Other types of deposits 26 that form or collect on internal surface 21 during service may be cleaned using the principles of the present invention. While the mechanisms of deposit accumulation and resulting damage differ between Arizona Road dust and sulfidation scales, the cleaning methods are substantially identical for removing both varieties of these deposits 26.

With reference to FIGS. 2B and 2C, the deposits 26 may be removed from the internal surface 21 by a cleaning process that is initiated by inserting or placing an amount of a substance 28 into at least a portion of the internal passage 20. Various techniques apparent to a person having ordinary skill in the art may be used to insert the substance 28 into the internal passage 20. An exemplary technique is to place the substance 28 into a syringe and then manipulate the syringe to introduce the substance 28 into the internal passage 20.

The substance 28, which at least partially fills the internal passage 20 after being placed therein, includes a halogen-containing organic compound, such as a fluorine-containing organic compound. The fluorine-containing organic compound, which is in a solid form, may be either a simple organic compound or a polymeric compound. As understood by a person having ordinary skill in the art, a polymeric compound includes repeating units that are derived from lower molecular weight compounds, i.e. monomers. Other halogen-containing organic compounds that includes, for example, bromine, chlorine, combinations of bromine and chlorine, or combinations of one or both with fluorine may be used as a substitute for the fluorine-containing organic compound in substance 28.

Polymeric fluorine-containing organic compounds advantageous for use in substance 28 include, but are not limited to, organic fluoropolymers. Particularly suitable organic fluoropolymers include, but are not limited to, polytetrafluoroethylene (PTFE) commercially available under the trade name TEFLON® from DuPont (Wilmington, Del.), ethylene-tetrafluoroethylene (ETFE), which is a copolymer of ethylene and tetrafluoroethylene, and polyethylene-chlorotrifluoroethylene commercially available under the tradename HALAR® from Ausimont U.S.A., Inc. (Thorofare, N.J.). PTFE melts at about 500° F. and decomposes at temperatures above about 680° F. to produce gaseous pyrolysis products, ETFE melts at about 480° F. and decomposes above the melting point to produce gaseous pyrolysis products, and polyethylene-chlorotrifluoroethylene melts at about 430° F. and decomposes above the melting point to produce gaseous pyrolysis products.

The substance 28 may further include a binder blended or mixed with the fluorine-containing organic compound. The relative proportion of the fluorine-containing organic compound to the binder in the mixture constituting substance 28 is contingent upon, among other variables, the extent of the sulfidation corrosion damage and the geometry of the internal passage 20. The addition of a binder, which may or may not be water-based, is believed to be particularly advantageous if the fluorine-containing organic compound in substance 28 is in the form of discrete particles, such as a powder. If not already supplied in a powder form, the fluorine-containing organic compound in substance 28 may be ground into a powder, which may have a particle size in the range of from about −60 mesh to about −325 mesh, and blended with the binder before insertion into the internal passage 20. The substance 28 may optionally include solid carbon, such as particles of graphite, a metal carbide, or combinations thereof.

A suitable type of binder for use in substance 28 is a polymeric braze binder material, such as Cotronics 4B3, which is commercially available from Cotronics Corp. (Brooklyn, N.Y.) or DB100, which is commercially available from DSM Technologies Ltd. (Cincinnati, Ohio), that may have the form of a viscous paste. The proportion by volume of the fluorine-containing organic compound in substance 28 to the binder may be, for example, about 95:5 for a mixture of ETFE with Cotronics 4B3. When heated, such polymeric braze binder materials burn relatively clean so that little or no residue is left behind after the substance 28 is consumed by the cleaning process.

After being placed into the internal passage 20, the substance 28 is then heated to precipitate cleaning of the deposits 26 from the internal surface 21. To that end, the turbine engine component 10, which has the substance 28 inside the internal passage 20, may be placed into an enclosure 30 (FIG. 2C), such as a furnace, that heats the turbine engine component 10 and substance 28 to temperatures effective to boil (i.e., liquefy) and vaporize the substance 28 in a two phase cleaning process. The atmosphere inside the furnace enclosure 30 may depleted of oxygen to provide, for example, an environment predominately consisting of an inert gas such as argon or nitrogen that has displaced atmospheric gases, a vacuum environment substantially evacuated of atmospheric gases, or a partial vacuum pressure. A suitable partial vacuum environment may be a pressure of about 120 Torr provided by coupling a liquid ring vacuum pump to the retort of the furnace enclosure 30.

In the first phase of the cleaning process, the substance 28 is heated to a temperature effective to at least melt and, preferably, boil the fluorine-containing organic compound in substance 28. The first temperature in the cleaning process is above the melting point and, preferably, at the boiling point at which the melted or liquefied fluorine-containing organic compound in substance begins to turn into a gas or vapor. The first temperature may be established by heat transfer from the heated turbine engine component 10, which may itself be heated to a higher temperature due to heat losses. For example, if the fluorine-containing organic compound in substance 28 is ETFE, the substance 28 may be heated to boiling (i.e., about 500° F.) for twenty (20) to thirty (30) minutes during the initial phase of the cleaning procedure.

The liquefied and boiling fluorine-containing organic compound contains fluorine-containing species, which readily reacts with deposits 26 at the elevated temperature. Fluorine, which is highly electronegative and a strong oxidizing agent may produce reaction products, such as fluorides, by direct chemical reaction with deposits 26. The reaction products from the deposits 26 may be dissolved as a solute into the substance 28, may be transformed or converted chemically into a modified chemical compound, such as a solid fluoride, that still adheres on the internal surface 21 of the internal passage 20, or may be converted chemically into a modified chemical compound that is suspended as particulate matter in the liquefied substance 28.

Generally, the fluorine-containing organic compound in substance 28 is maintained at the elevated boiling temperature for a cleaning time sufficient to promote chemical conversion of the deposits 26 to a form that can be removed or cleaned from the internal surface 21. The turbine engine component 10 may be oriented such that the heated substance 28 does not flow out of the internal passage 20 during the cleaning process. Alternatively, tooling may be used to close one or more of ports 24, and other features that communicate with the internal passage 20, such that the boiling solution is retained in the internal passage. The typical time for holding at the first temperature may be about 20 minutes to about 30 minutes, although the invention is not so limited.

In a second phase of the cleaning treatment, the temperature of the chemically modified deposits 26 is raised to or above a boiling point or sublimation point (i.e., a vaporization point) of substantially all of the reaction products from the initial phase of the cleaning process, which produces a vapor 32. Preferably, this second temperature is higher than the vaporization point of the most thermally-stable reaction product in the chemically modified deposits 26. The elevated temperature for the chemically modified deposits 26 may be accomplished by heat transfer from the heated turbine engine component 10. The second temperature is significantly higher than the boiling temperature of the fluorine-containing organic compound in substance 28, which vaporizes the fluorine-containing organic compound in substance 28. During this bake-out, the vapor 32 is removed by mass transport, along with the vaporized portions of substance 28, through the internal passage 20 for release to the exterior of the turbine engine component 10. For example, the chemically modified deposits 26 may be heated at a temperature of about 1100° F. and for a time of about thirty (30) minutes to perform a bake-out advantageously in an environment maintained at a partial vacuum pressure that transforms the chemically modified deposits 26 to vapor 32 for removal. However, a person having ordinary skill in the art will appreciate that the time, temperature and pressure may be varied to enhance removal of the chemically modified deposits 26. For example, the vaporization temperature may be as high as 1800° F. The flow rate of vapor 32 through the internal passage 20 will be contingent, among other variables, the dimensions of the internal passage 20.

In an alternative embodiment, the chemically modified deposits 26 merely loosened from the internal surface, but not fully released from the internal surface 21, may be removed from the internal passage 20 by a secondary treatment, such as a solvent bath or an air blast. The loosened deposits 26 may also be removed with dilute Aqua Regia or high-pressure water.

Residues from the cleaning that remain on the internal surface 21 may be removed by exposing the residue to a reducing atmosphere in a subsequent process step. For example, an amount of a metal hydride, such as titanium hydride, may be placed into the internal passage 20 and heated to advantageously release hydrogen effective for removing these residues. Residual titanium from the reacted titanium hydride may advantageously operate as a getter for compounds in the residues.

Advantageously, the superalloy material constituting the turbine engine component 10 is typically more chemically inert to the fluorine-containing species in the substance 28 than the deposits. As a result, the substrate 28 is not significantly damaged by the cleaning process. Nevertheless, areas on the external surface 22 of substrate 12 may be masked during the cleaning procedure if masking is required.

In accordance with an alternative embodiment of the invention and with reference to FIG. 3 in which like reference numerals refer to like features in FIGS. 2A-C, an internal coating, such as a chromium (i.e., chromide) coating 34, may be optionally re-applied or applied to the cleaned internal surface 21. The chromium-containing coating 34 contains metallic chromium in excess of any amount of chromium that may be present in the base superalloy of substrate 12. Generally, chromium-containing coatings 34 are advantageous for turbine engine components 10 operating in low-pressure engine stages.

As an initial step for forming the chromium-containing coating 34, the substance 28 placed into the internal passage 20 is modified by the addition of an amount of elemental chromium or another chromium-containing material (e.g., compound or alloy), which may be in a powder form. In one specific embodiment, the substance 28 may include about four (4) percent by weight (wt %) to about 8 wt % of chromium metal powder, about two (2) wt % of ETFE, about two (2) wt % of ammonium bifluoride, and balance alumina powder of mesh size −325 and 99% purity.

The substance 28 is heated, for example inside the heated enclosure 30, at a temperature effective to release a vapor containing chromium from the elemental chromium or chromium-containing compound in the substance 28. The vapor 40 is released from the substance 28 until the amount of elemental chromium or chromium-containing compound in substance 28 is consumed. Typically, substance 28 is fully consumed after the cleaning and/or coating process is completed. The vapor 40 is mass transported as a stream along the length of the internal passage 20 and interacts with the internal surface 21 during transport. Specifically, chromium or another chromium-containing substance is deposited from the vapor 40 as the chromium-containing coating 34 onto the internal surface 21. The vapor 40 is supplied to the internal passage 20 for a time effective to coat the internal surface 21 with the chromium-containing coating 34.

Typically, the substance 28 is heated to a higher temperature during the combined cleaning/coating process than the first and second temperatures required for the two-stage cleaning treatment alone. For example, the substance 28 and, optionally, the turbine engine component 10 may be heated to a temperature in the range of about 1850° F. to about 1975° F., preferably about 1850° F., for approximately four hours to coat the internal passages of most turbine engine components 10.

The temperature of the substance 28 may be ramped initially to the boiling and vaporization temperatures of the fluorine-containing organic compound for a time effective to clean or substantially the internal surface 21. The substance is then be heated to a higher temperature effective to release or liberate vapor 40 that includes the vaporized chromium-containing substance, which is transported through the internal passage 20 for forming the coating 34. The temperature of substance 28 may be ramped at a rate such that vapor 32 and vapor 40 are both present within the internal passage 20 over at least a portion of the heating time such that the internal surface 21 is cleaned and coated substantially simultaneously, which be advantageous for small residual deposits 26 that may be subsumed into the coating 34. Preferably, however, the internal surface 21 is cleaned of deposits 26 before receiving the coating 34 such that at the least a majority of the deposits 26 are removed and, preferably, substantially all of the deposits 26 are removed.

Using this method, damage previously caused by the deposits 26 may be repaired. The chromium-containing coating 34 also offers environmental or protective shielding that enhances the corrosion resistance of the superalloy base metal of the substrate 12. This improves the reliability, maintainability and quality of the turbine engine component 10. In particular, the chromium-containing coating 34 is effective to protect the component 10 against future hot corrosion at operating temperatures below 1500° F. Chromium from the coating may also cover any residues from the cleaning process that remain on the internal surface 21.

In use and with reference to FIGS. 2A-C and 3, the turbine engine component 10, which has been removed from the turbine engine, includes deposits 26. Substance 28 is prepared and inserted into a portion of the internal passage 20 through one of the ports 24, as shown in FIG. 2B. As shown in FIG. 2C, the substance 28, and optionally the temperature of the gas turbine component 10, heated to a first cleaning temperature effective to boil the fluorine-containing organic compound in substance 28, which provides chemical reactivity with deposits 26 on internal surface 21. The temperature is elevated further to vaporize the substance 28 and the chemically-modified deposits 26 for removal by mass transport as vapor 32 out of the internal passage 20. As shown in FIG. 3, substance 28 may optionally include a chromium-containing compound or alloy released as vapor 40 to form the optional chromium-containing coating 34, preferably, after the cleaning process is concluded or substantially concluded.

While the present invention has been illustrated by the description of an embodiment thereof and specific examples, and while the embodiment has been described in considerable detail, it is not intended to restrict or in any way limit the scope of the appended claims to such detail. Additional advantages and modifications will readily appear to those skilled in the art. For example, although the present invention is described herein in conjunction with applying a chromium-containing coating, a person having ordinary skill in the art will appreciate that coating have a different composition, such as a significant aluminum content as opposed to chromium content. In this latter situation, an amount of an elemental aluminum, an aluminum alloy or an aluminum-containing compound such as aluminum chloride may be added to substance for purposes of forming an aluminum-containing coating that may be appropriate for turbine engine components used in high-pressure engine stages. The invention in its broader aspects is therefore not limited to the specific details, representative apparatus and methods and illustrative examples shown and described. Accordingly, departures may be made from such details without departing from the scope or spirit of applicant's general inventive concept.

Having described the invention, what is claimed is:

1. A method for cleaning a material from a surface bounding an internal passage in a turbine engine component, the method comprising:
    placing a substance including an organic fluoropolymer in solid form into the internal passage;
    heating the organic fluoropolymer to a first temperature and for a time sufficient to chemically modify the material and make the material susceptible for removal from the surface;
    heating the chemically-modified material to a second temperature higher than the first temperature to vaporize the chemically-modified material; and
    removing the vaporized chemically-modified material from the surface of the internal passage,
    wherein the first temperature is above a melting point and at a boiling point of the organic fluoropolymer, and the second temperature is above the boiling point of the organic fluoropolymer.

2. The method of claim 1 further comprising:
    heating the turbine engine component to heat the organic fluoropolymer to the first and second temperatures.

3. The method of claim 1 further comprising:
    blending the organic fluoropolymer with a binder to form the substance inserted into the internal passage.

4. The method of claim 1 further comprising:
    blending the organic fluoropolymer with a braze binder to form the substance inserted into the internal passage.

5. The method of claim 1 wherein the organic fluoropolymer is selected from the group consisting of polytetrafluoroethylene, ethylene-tetrafluoroethylene, and polyethylene-chlorotrifluoroethylene.

6. The method of claim 1 wherein removing the vaporized chemically-modified material from the surface of the internal passage further comprises:
    transporting a vapor containing the chemically-modified material from the surface of the internal passage to an exterior of the turbine engine component.

7. The method of claim 1 further comprising:
    applying a protective coating to the internal passage as the chemically modified material is removed from the surface of the internal passage.

8. The method of claim 1 further comprising:
    applying a protective coating to the surface of the internal passage after the chemically-modified material is removed from the surface of the internal passage.

9. The method of claim 1 wherein the material comprises sulfidation scales resulting from sulfidation corrosion when the turbine engine component is in service in a turbine engine.

10. The method of claim 1 wherein the material comprises dust particles infiltrating into the internal passage when the turbine engine component is in service in a turbine engine.

11. The method of claim 1 wherein a residue remains on the surface of the internal passage after the chemically-modified material is removed from the surface of the internal passage, and further comprising:
    exposing the residue to a reducing atmosphere effective to remove the residue.

12. The method of claim 1 further comprising:
    before heating to the first temperature, placing the turbine engine component and the substance in an inert atmosphere, a vacuum atmosphere, or a partial vacuum.

13. The method of claim 1 wherein the solid form of the organic fluoropolymer is a powder.

14. The method of claim 1 wherein the organic fluoropolymer is ethylene-tetrafluoroethylene and the first temperature is about 500° F.

15. The method of claim 1 wherein the time ranges from about 20 minutes to about 30 minutes.

16. The method of claim 8 wherein the protective coating is a chromium-containing coating, and applying the chromium-containing coating further comprises:
    adding a chromium-containing material to the substance placed into the internal passage;
    heating the chromium-containing material to form a chromium-containing vapor; and
    transporting the chromium-containing vapor along the internal passage for deposition as the chromium-containing coating.

17. The method of claim 8 wherein the protective coating is an aluminum-containing coating, and applying the aluminum-containing coating further comprises:
    adding an aluminum-containing material to the substance placed into the internal passage;
    heating the aluminum-containing material to form an aluminum-containing vapor; and
    transporting the aluminum-containing vapor along the internal passage for deposition as the aluminum-containing coating.

18. The method of claim 11 wherein exposing the residue to a reducing atmosphere further comprises:
    placing a metal hydride into the internal passage; and
    thermally reacting the metal hydride to release hydrogen effective for removing the residue.

19. The method of claim 18 wherein the metal hydride is titanium hydride and titanium is freed when the titanium hydride is thermally reacted, and further comprising:
    gettering compounds in the residue with the titanium.

20. A method for cleaning a material from a surface of a turbine engine component, the method comprising:
    placing a substance including an organic fluoropolymer in solid form on the surface;

heating the organic fluoropolymer to a first temperature and for a time sufficient to chemically modify the material and make the material susceptible for removal from the surface;

heating the chemically-modified material to a second temperature higher than the first temperature to vaporize the chemically-modified material; and removing the vaporized chemically-modified material from the surface, wherein the first temperature is above a melting point and at a boiling point of the organic fluoropolymer, and the second temperature is above the boiling point of the organic fluoropolymer.

21. The method of claim 20 further comprising:

heating the turbine engine component to heat the organic fluoropolymer to the first and second temperatures.

22. The method of claim 20 further comprising:

blending the organic fluoropolymer with a binder or a braze binder to form the substance placed on the surface.

23. The method of claim 20 wherein the organic fluoropolymer is selected from the group consisting of polytetrafluoroethylene, ethylene-tetrafluoroethylene, and polyethylene-chlorotrifluoroethylene.

24. The method of claim 20 wherein the material comprises sulfidation scales resulting from sulfidation corrosion when the turbine engine component is in service in a turbine engine.

25. The method of claim 20 wherein the material comprises dust particles infiltrating into the surface when the turbine engine component is in service in a turbine engine.

26. The method of claim 20 wherein a residue remains on the surface after the chemically-modified material is removed from the surface, and further comprising:

exposing the residue to a reducing atmosphere effective to remove the residue.

27. The method of claim 20 further comprising:

before heating to the first temperature, placing the turbine engine component and substance in an inert atmosphere, a vacuum atmosphere, or a partial vacuum.

28. The method of claim 20 wherein the solid form of the organic fluoropolymer is a powder.

29. The method of claim 20 wherein the organic fluoropolymer is ethylene-tetrafluoroethylene and the first temperature is about 500° F.

30. The method of claim 20 wherein the time ranges from about 20 minutes to about 30 minutes.

31. The method of claim 26 wherein exposing the residue to a reducing atmosphere further comprises:

contacting a metal hydride with the surface; and thermally reacting the metal hydride to release hydrogen effective for removing the residue.

32. The method of claim 31 wherein the metal hydride is titanium hydride and titanium is freed when the titanium hydride is thermally reacted, and further comprising:

gettering compounds in the residue with the titanium.

* * * * *